United States Patent

Henkler et al.

[15] 3,654,021

[45] Apr. 4, 1972

[54] BONDING PHOTOSENSITIVE PLATES, SHEETING OR FILM TO METALLIC SUPPORTS

[72] Inventors: Herbert Henkler, Darmstadt; Heinrich Hartmann; Klaus Gulbins, both of Limburgherhof; Hans Wilhelm, Heinsheim, all of Germany

[73] Assignee: Badische Anilin- & Soda-Fabrik Akteingesellschaft, Ludwigshafen am Rhine, Germany

[22] Filed: Oct. 28, 1968

[21] Appl. No.: 771,276

[30] Foreign Application Priority Data

Oct. 28, 1967 Germany ......................P 15 97 515.2

[52] U.S. Cl. ..................................156/331, 96/33, 96/86 R, 96/86 P, 101/457, 156/310, 156/332, 161/190

[51] Int. Cl. ..........................................................C09j 3/16

[58] Field of Search ..................156/331, 332; 101/456, 457; 96/86, 33

[56] References Cited

UNITED STATES PATENTS

| | | | |
|---|---|---|---|
| 2,993,789 | 7/1961 | Crawford | 96/35 |
| 3,345,171 | 10/1967 | Laridon et al. | 96/36 |
| 3,497,356 | 2/1970 | Martinson | 96/86 |
| 3,505,252 | 4/1970 | Brotherton et al. | 260/2.5 |
| 3,198,692 | 8/1965 | Bridgeford | 161/188 |
| 3,255,068 | 7/1966 | Smith | 161/190 |
| 3,255,069 | 7/1966 | Crowley et al. | 161/190 |
| 3,390,037 | 6/1968 | Christie | 156/148 |
| 3,475,384 | 10/1969 | Trischler | 260/77.5 |
| 3,490,987 | 1/1970 | Bauriedel | 161/190 |

*Primary Examiner*—Carl D. Quarforth
*Assistant Examiner*—E. A. Miller
*Attorney*—Johnston, Root, O'Keeffe, Keil, Thomson & Shurtleff

[57] ABSTRACT

A process for applying photosensitive plates, film or sheeting of a polymerized base material to a metallic support using a reaction product of an oligomer and/or polymer containing active hydrogen atoms and a polyisocyanate as bonding agent.

8 Claims, No Drawings

BONDING PHOTOSENSITIVE PLATES, SHEETING OR FILM TO METALLIC SUPPORTS

This invention relates to photopolymerizable plates and to a process for applying a photosensitive photopolymerizable plate, film or sheeting of a polymerized base material, particularly of a polyamide, one or more photopolymerizable monomers, a polymerization initiator and a polymerization inhibitor with or without one or more plasticizers and/or dyes to a metallic support.

It is known that plates, film or sheeting which consists for example of a mixture of soluble polyamides and compounds having at least two photopolymerizable double bonds and a polymerization initiator can be used for the production of printing plates or for circuit elements for pneumatic control engineering. Crosslinking of the exposed areas takes place under the action of light during exposure of the plate under an image-bearing transparency. The relief is then prepared by dissolving away the unexposed areas with a solvent.

Examples of soluble polyamides which may serve as base material are copolyamides of epsilon-caprolactam, the salt of adipic acid and hexamethylenediamine and the salt of adipic acid and diaminodicyclohexylmethane or the salt of adipic acid with hexamethylenediamine, laurolactam and epsilon-caprolactam. These polyamides must be soluble in convential organic solvents, such as alcohols and/or ketones, in particular in mixtures containing mainly alcohols. Examples of compounds having at least two polymerizable double bonds are the diacrylates, dimethacrylates, polyacrylates and polymethacrylates of polyols or diamines and polyamines, and analogous compounds of acrylic acid and methacrylic acid with urea, guanidine and melamine. In order to increase photosensitivity the layers contain photoinitiators which under the action of light decompose into radicals and initiate or accelerate the polymerization. Vicinal ketaldonyl compounds such as diacetyl and benzil, or $\alpha$-ketaldonyl alcohols, for example benzoin, or acyloin ethers such as benzoin methyl ether and $\alpha$-substituted aromatic acyloin such as $\alpha$-methylbenzoin are suitable for the purpose. These photoinitiators are used in amounts of from 0.01 to 2 percent by weight with reference to the whole mixture. To prevent premature polymerization during storage of the plates, the mixtures contain also a polymerization inhibitor.

Polyamides are particularly suitable for the production of the plates as already mentioned, because they are very resistant to abrasion and this is of great importance for the use of relief-bearing plates in printing. Photosensitive plates based on polyamides have the disadvantage that they do not bond well to metallic base material to which the plates, film or sheeting are conventionally laminated and the photosensitive layer often becomes detached from the metallic base during storage of the plates. The material thus becomes useless for later use for the production of printing plates.

We have now found that photosensitive plates, sheeting or film of a polymerized base material, particularly of polyamide, can be bonded particularly firmly to a metallic base by using as the bonding agent a reaction product of an oligomer and/or polymer containing active hydrogen atoms with a polyisocyanate.

Conventional reaction accelerations may be added to the bonding agent to accelerate the reaction.

It is also possible to incorporate pigments into the adhesive layer so that it acts at the same time as an antihalation layer.

Examples of organic oligomers and/or polymers bearing active hydrogen atoms and having a molecular weight of up to about 5,000 in accordance with this invention are copolymers which have been prepared using polymerizable monomers which contain active hydrogen atoms, i.e. possess in an organic compound a hydrogen atom that can be replaced by sodium and reacts with an isocyanate group. Examples of monomers containing active hydrogen atoms are monomers containing hydroxyl groups, in particular alcohols, carboxyl groups, primary or secondary amino groups or amido groups.

Examples of suitable monomers are monobasic and polybasic unsaturated carboxylic acids such as acrylic acid, methacrylic acid, crotonic acid, maleic acid and fumaric acid, and particularly preferentially the partial esters of diols or polyols, particularly those having two to 12 carbon atoms, with olefinically unsaturated carboxylic acids having three to five carbon atoms, particularly the monoacrylates or monomethacrylates of a 1,2-glycol, 1,3-glycol or 1,4-glycol such as an alkanediol, e.g. ethylene glycol, 1,2-propanediol or 1,4-butanediol. Unsaturated amines such as allylamine or p-aminostyrene and the amides of unsaturated carboxylic acids such as acrylamide, methacrylamide, crotonamide, itaconamide and the N-monosubstituted, particularly the N-methylol compounds of these unsaturated acid amides may also be used for the production of the oligomers of polymers.

It is also preferred to use as polymers containing active hydrogen atoms, mixtures which consist of 90 to 50 parts of a branched polyester from a dicarboxylic acid such as adipic acid and an aliphatic polyol such as a mixture of 1,4-butanediol and glycerol and 10 to 50 parts of a copolymer of 10 to 30 percent by weight of an ethylenically unsaturated compound containing hydroxyl groups and 90 to 70 percent by weight of ethylenically unsaturated compounds which do not contain hydroxyl groups; of the former the esters of acrylic acid or methacrylic acid with glycols, in particular alkanediols, are again preferred and of the latter for example styrene and/or acrylic or methacrylic esters of alcohols having one hydroxyl group and one to eight carbon atoms, such as tert-butyl acrylate, are preferred.

In addition to these polymers containing active hydrogen atoms, polycondensation and polyaddition compounds having free hydrogen atoms may also be used for the reaction according to this invention.

Examples of polycondensation compounds are low molecular weight polyesters having free carboxyl or hydroxyl groups, polyethers having free hydroxyl groups, polyamides having free carboxylic groups or free amino groups, polyurethanes having free hydroxyl groups and finally also phenol-formaldehyde condensates provided they are still soluble. Suitable compounds are e.g. described in the book by J.H. Saunders and K.C. Frisch, Polyurethanes, Part I: Chemistry, Chapter II, New York, 1962.

The polyisocyanates used for the production of the bonding layer may be aromatic polyisocyanates such as toluylene diisocyanate, thiophosphoric-tris-(p-isocyanatophenyl ester) and/or bis-(4-isocyanatophenyl)-methane and aliphatic, cycloaliphatic or araliphatic isocyanates, such as hexamethylene diisocyanate or bis-(4-isocyanatocyclohexyl)-methane. Adducts of polyalcohols and diisocyanates which contain at least two free isocyanato groups, for example the adduct of 1 mole of 1,1,1-trimethylolpropane and 3 moles of 2,4-toluylene diisocyanate, may also be used. Polyisocyanates which have been prepared by treatment of strongly acid condensed aniline-formaldehyde resins with phosgene may also be used. Blocked isocyanates, which only react with liberation of isocyanato groups at elevated temperature, may also be used, e.g. the reaction product of said polyisocyanates and a phenol. Obviously an appropriately elevated temperature then has to be chosen for the production of the bonding layer, such as a temperature above 100° C.

The isocyanate component is generally used in a molar ratio with reference to the active hydrogen atoms in the oligomers or polymers, but it is possible to deviate widely below and often above the molar ratio, depending on the desired elasticity or the tackiness of the bonding layer.

A preferred embodiment of the process according to this invention resides in coating one of the surfaces to be bonded with the isocyanate component while the other surface is coated with the component containing active hydrogen atoms. When the surfaces to be bonded are then brought together, reaction takes place with crosslinking. This bonding or lamination may be carried out in the presence or absence of solvents. The solvents for the components or their mixture should be inert to isocyanates, i.e. they should not contain any active hydrogen atoms, as for example aliphatic esters such as ethyl acetate or ketones such as acetone.

The temperature at which bonding takes place may be varied within wide limits. The reaction is however generally carried out at a temperature of from 20° to 150° C., temperatures of from 25° to 105° C. being preferred.

Another embodiment of the process of production consists in mixing the isocyanate component and the component containing active hydrogen atoms, with or without a solvent, applying the mixture to one or both of the surfaces to be bonded, evaporating any solvent used and bringing the two surfaces into contact. Evaporation of solvent is generally carried out at room temperature. Elevated temperatures may however be used.

One of the surfaces to be bonded may furthermore be coated with a mixture of the component having active hydrogen atoms and the isocyanate, the isocyanate component being present in a molar deficiency, so that only incomplete crosslinking takes place. The second surface to be bonded is then coated with a mixture of polymer or oligomer having active hydrogen atoms and a molar excess of polyisocyanate.

In this way it is possible for the mixture containing a deficiency of isocyanate which has been applied to the metallic base to be cured at elevated temperature, preferably at a temperature of from 50° to 150° C. Improved adherence of the layer to the base is thus achieved. The two surfaces may then be bonded at room temperature.

If desired the bonding may be accelerated by conventional accelerators for polyisocyanate reactions. Examples of such accelerators are tertiary amines such as pyridine, triethylamine, endoethylenepiperazine, and also tin compounds such as tin stearate and dibutyl tin laurate.

So that the bonding layer may at the same time undertake the role of an antihalation layer, pigments may be incorporated into the layer. Conventional inorganic and organic pigments such as iron oxide, lead chromate, barium chromate or carbon black are suitable.

The application of the bonding layer to the surface to be bonded may be carried out by any conventional technique, as for example by brushing, spraying, dipping or pouring.

The advantage of a bonding layer according to this invention resides in the fact that it is completely insoluble in the solvents conventionally used for the production of relief layers and insensitive to elevated temperatures. It gives an extremely durable and very firm bond between the photopolymerizable layer and the metallic base.

The process according to this invention is suitable not only for photosensitive layers based on polyamides, but photopolymerizable layers of polyesters and cellulose derivatives may also be bonded to metallic base material.

The invention is illustrated by the following examples. The parts given in the following Examples are by weight.

EXAMPLE 1

A solution of 70 parts of an alcohol-soluble polyamide (prepared by polycondensation of 35 parts of p,p'-diammoniumdicyclohexylmethane adipate and 30 parts of epsilon-caprolactam, 7 parts of triethyleneglycol diacrylate, 14 parts of m-xylylenebisacrylamide, 8.2 parts of N-methylolacrylamidebisglycol ether and 0.1 part of p-methoxyphenol in 300 parts of methanol is cast into thin sheeting. After it has dried, the sheeting has a thickness of 0.5 mm. The residual methanol content is 8 percent by weight.

A degreased steel sheet is coated with a priming mixture consisting of 30 parts of a branched polyester (which has been prepared by polycondensation of 3 moles of adipic acid, 1 mole of glycerol and 3 moles of butylene glycol and which has a hydroxyl number of about 165), 20 parts of a 65 percent solution of a copolymer of 20 parts of 1,4-butanediol monoacrylate, 25 parts of styrene and 55 parts of tertbutyl acrylate in ethyl glycol acetate (hydroxyl number of the solid resin: 80), and 25.5 parts of a 75 percent solution of the reaction product of 1 mole of trimethylolpropane and 3 moles of toluylene diisocyanate in ethyl acetate and cured for 1 hour at 100° C.

The same mixture is then sprayed onto the priming layer. After the solvent has been exposed to the air for a short time, the steel sheet is covered with the cast sheeting described above and the two passed together through a pair of rubber rollers under moderate pressure. After a cure time of 3 days, the plate is exposed for 8 minutes under a line negative in commercial copying equipment for photopolymer plates. After the relief has been washed out with a mixture (2:7:1) of benzene, methanol and water a relief plate is obtained whose individual parts adhere well to the steel base and which gives good results in relief printing.

EXAMPLE 2

Cast sheeting having a total thickness of 0.8 mm is prepared in the manner described in Example 1. Degreased aluminum sheeting having a thickness of 0.9 mm is coated with a primer having the following composition and baked for 1 hour at 100° C.: 40 parts of a branched polyester having a hydroxyl number of 165 (prepared by polycondensation of 3 moles of adipic acid, 1 mole of hexanetriol-1,3-6 and 3 moles of butylene glycol), 10 parts of a 65 percent solution of a copolymer of 20 parts of 1,4-butanediol monoacrylate, 30 parts of styrene and 50 parts of tert-butyl acrylate in methylene chloride (hydroxyl number: 80), 98.4 parts of a 20 percent solution of thiophosphoric acid-tris-(p-isocyanatophenyl ester) in methylene chloride and 30 parts of iron oxide yellow 930 (Bayer).

After this priming coat has been baked, the same mixture (but omitting the pigment) is used to laminate the abovementioned cast sheeting to the primed aluminum sheet using a pair of rubber rollers. After a cure time of 3 days, the plate is exposed using a line halftone negative in vacuum copying equipment for 10 minutes and then washed out with a mixture (5:3:2) of propanol, ethanol and water.

A relief-bearing plate is thus obtained whose individual areas and dots adhere well to the aluminum sheet. Results achieved with this plate in relief printing are excellent.

EXAMPLE 3

The procedure described in Example 2 is followed but with the difference that the mixture used for coating the aluminum sheet (with omission of the pigment) is also brushed onto the dry surface of the cast sheeting to be bonded. After exposure to the air for a short time, the cast sheeting and the aluminum sheet are pressed together between two rubber rollers. After the bonding layer has been cured for 2 days, the plate is further processed as described in Example 2. It is suitable as a printing plate in letterpress printing.

EXAMPLE 4

A mixture of 70 parts of the copolyamide described in Example 1, 12.5 parts of N-methylolacrylamidebisglycol ether, 12.5 parts of m-xylylenebisacrylamide, 4 parts of ethylene glycol, 0.19 part of benzoin methyl ether and 0.1 part of hydroquinone in 300 parts of a mixture (9:1) of methanol and water is cast in a casting machine into a film which after evaporation of the solvent has a thickness of 0.4 mm.

The upper side of the dried film is coated with a mixture consisting of 30 parts of the branched polyester specified in Example 2, 10 parts of a polyester prepared by condensation of 3 moles of adipic acid, 1 mole of glycerol and 3 moles of butylene glycol and having a hydroxyl number of about 220, 10 parts of a 65 percent solution of a copolymer of 15 parts of ethylene glycol monoacrylate, 25 parts of methyl methacrylate and 60 parts of tert-butyl acrylate in a mixture (1:1) of ethyl glycol acetate and xylene and having a hydroxyl number of the solid resin of 72.5, 50 parts of ethyl acetate and 44 parts of the polyisocyanate described in Example 1 and the solvent is allowed to evaporate.

A pale brown lacquered aluminum sheet (1.0 mm) is also coated with the above mixture. After exposure to the air for a short time, the cast film is rolled onto the coated aluminum sheet with its prepared surface in contact therewith between two rollers under light pressure. After a cure time of 2 days, the plate is exposed and washed out as described in Example 1. The printing plate obtained is used for relief printing, excellent results being obtained.

EXAMPLE 5

The procedure of Example 4 is followed but with the difference that the upper side of the dried film is treated (analogously to Example 4) with a mixture which contains only 26 parts of polyisocyanate (about 40 percent deficiency) instead of 44 parts, whereas the aluminum sheet is coated with a mixture which contains 62 parts of polyisocyanate (about 40 percent excess). The plate is further processed as described in Example 4. It is also suitable as a printing plate in relief printing.

EXAMPLE 6

A mixture of 70 parts of a copolyamide of 60 parts of a salt of adipic acid and hexamethylenediamine and 40 parts of caprolactam, 20 parts of N-methylolacrylamidebisglycol ether, 5 parts of m-xylylenebisacrylamides, 4 parts of ethylene glycol, 0.9 part of benzoin isopropyl ether and 0.1 part of hydroquinone in 200 parts of a mixture (85:15) of ethanol and water is cast in a casting machine into a film which after the solvent has been evaporated (at 80° to 100° C.) has a thickness of 0.4 mm.

Sheet steel (0.24 mm) which has been tinned on one side is coated on the untinned side with the priming mixture described in Example 1 which contains 36 parts of the polyisocyanate instead of 25.5 parts and is additionally pigmented with iron oxide yellow 930 (Bayer), and baked for 50 minutes at 120° C. The coated sheet steel is then moistened with a mixture (9:1) of propanol and water and coated with the cast film between two rubber rollers. After a cure time of about 24 hours, the plate may be exposed, washed out and used for relief printing as described in Example 1.

We claim:

1. In a process for bonding a photosensitive layer comprising a polyamide base, one or more photopolymerizable monomers and a photoinitiator by means of a bonding layer to a metallic base for the production of relief-bearing plates, the improvement which comprises using, as the bonding layer, a reaction product of:

a. a mixture consisting essentially of 90 to 50 parts of a branched polyester having active hydrogen atoms which are reactive with isocyanates, said polyester being derived from a dicarboxylic acid and a mixture of aliphatic polyols, including at least one polyol having more than two hydroxyl groups, and 10 to 50 parts of a copolymer of 10 to 30 percent by weight of an ethylenically unsaturated compound containing hydroxyl groups and 90 to 70 percent by weight of a mixture of ethylenically unsaturated compounds which do not contain hydroxyl groups, and b. a polyisocyanate.

2. A process as claimed in claim 1 wherein the branched polyester is produced from adipic acid and a mixture of aliphatic polyols selected from the group consisting of butylene glycol, glycerol and hexanetriol-1,3,6.

3. A process as claimed in claim 2 wherein the branched polyester is produced from adipic acid and a mixture of butylene glycol and glycerol.

4. A process as claimed in claim 2 wherein the branched polyester is produced from adipic acid and a mixture of butylene glycol and hexanetriol-1,3,6.

5. A process as claimed in claim 1 wherein the ethylenically unsaturated compound containing hydroxyl groups is selected from the group consisting of 1,4-butanediol monoacrylate and ethylene glycol monoacrylate.

6. A process as claimed in claim 1 wherein the mixture of ethylenically unsaturated compounds which do not contain hydroxyl groups consists of styrene and tert-butyl acrylate.

7. A process as claimed in claim 1 wherein the polyisocyanate is the reaction product of 1 mole of trimethylolpropane and 3 moles of toluylene diisocyanate.

8. A process as claimed in claim 1 wherein the polyisocyanate is thiophosphoric acid-tris-(p-isocyanatophenyl ester).

* * * * *